United States Patent [19]

Maytum et al.

[11] Patent Number: 5,815,359
[45] Date of Patent: Sep. 29, 1998

[54] SEMICONDUCTOR DEVICE PROVIDING OVERVOLTAGE PROTECTION AGAINST ELECTRICAL SURGES OF POSITIVE AND NEGATIVE POLARITIES, SUCH AS CAUSED BY LIGHTNING

[75] Inventors: Michael J. Maytum, Willington; Kevin Howard, Great Barford, both of England

[73] Assignee: Texas Instruments Incorporated, Dallas, Tex.

[21] Appl. No.: 821,492

[22] Filed: Mar. 21, 1997

Related U.S. Application Data

[63] Continuation of Ser. No. 525,456, Sep. 8, 1995, abandoned.

[51] Int. Cl.$^6$ ............................. H02H 1/00; H02H 3/22
[52] U.S. Cl. ........................... 361/111; 361/91; 361/126; 338/22 SD; 257/173
[58] Field of Search ........................... 361/117–119, 126, 361/56, 88, 91, 111; 257/109, 173; 338/225 D

[56] References Cited

U.S. PATENT DOCUMENTS

| | | | |
|---|---|---|---|
| 3,919,010 | 11/1975 | Borchert et al. | 148/189 |
| 4,325,074 | 4/1982 | Osada et al. | 257/109 |
| 5,352,905 | 10/1994 | Ohta | 257/38 |
| 5,473,170 | 12/1995 | Bernier | 257/174 |

FOREIGN PATENT DOCUMENTS

| | | |
|---|---|---|
| 518 790 A1 | 6/1992 | European Pat. Off. . |
| 184 884 | 7/1987 | United Kingdom . |
| 256 744 | 12/1992 | United Kingdom . |
| 263 579 | 7/1993 | United Kingdom . |

*Primary Examiner*—Jeffrey A. Gaffin
*Assistant Examiner*—Michael J. Sherry
*Attorney, Agent, or Firm*—William B. Kempler; Richard L. Donaldson

[57] ABSTRACT

An overvoltage protection device, particularly for protecting equipment against electrical surges caused by lightning, wherein the protective device includes a first protection element for protecting the equipment from an electrical surge of positive polarity and a second protection element for protecting the equipment from an electrical surge of negative polarity, the first and second protection elements having substantially asymmetric surge capabilities. More specifically, the overvoltage protection device comprises a semiconductor substrate of one conductivity type having first and second pluralities of dopant regions of the opposite conductivity type disposed therein and respectively opening onto upper and lower major surfaces of the semiconductor substrate. A buried dopant region of the opposite conductivity type is also disposed in the substrate between the first and second pluralities of dopant regions, the buried dopant region of the opposite conductivity type being arranged at varying depths within the substrate. This arrangement defines first and second thyristor structures in asymmetrical relation to each other, with the first thyristor structure being effective for overvoltage protection against an electrical surge of negative polarity, and the second thyristor structure being effective for overvoltage protection against an electrical surge of positive polarity.

8 Claims, 1 Drawing Sheet

SEMICONDUCTOR DEVICE PROVIDING OVERVOLTAGE PROTECTION AGAINST ELECTRICAL SURGES OF POSITIVE AND NEGATIVE POLARITIES, SUCH AS CAUSED BY LIGHTNING

This application is a Continuation of application Ser. No. 08/525,456, filed Sep. 8, 1995 now abandoned.

This invention relates to overvoltage protectors, particularly to those protectors which protect equipment against lightning surges.

Traditionally, Overvoltage Protectors are made to withstand the same peak value of lightning surge current in both polarities (positive and negative). The main reasons for this are:

1) The protection technology is inherently symmetrical Voltage Dependent Resistors (VDRs), (also called Metal-Oxide Varistors, MOVs) are an example of such a technology.
2) The protection component is not mechanically polarised, thus assembly in a particular orientation cannot be guaranteed VDRs and some gas discharge tubes, GDTs, are examples of this situation.
3) There is often a requirements that the equipment must meet specific standards. Standards specify that the equipment must withstand lightening having either positive or negative polarity surges. An example of this practice is CCITT K20 (1984) "Resistibility of telecommunication switching equipment to overvoltages and overcurrents". This standard recommends lightning test levels of ±1 KV and ±4 KV (paragraph 6.7 table 1 and table 2).

The generally accepted theory of lightning is that it is caused by differential charging of a cloud. The bottom of the cloud becomes negatively charged and the cloud top develops the corresponding positive charge, This creates a potential difference between the cloud bottom and earth. When the potential difference reaches a critical value, the air raptures and a portion of the negative charge is discharged by a lightning stroke. The remaining negative charge is usually discharged by subsequent strokes, following the ionised path of the first stroke. This lightning "flash" is seen as a single event, but usually consists of a series of strokes separated by about 20 ms intervals.

Positively charged lightning can often come from clouds that have been negatively discharged leaving the cloud with a net positive charge. When this charge discharges to earth, the resulting peak current wave form is usually greater in amplitude and duration than the negative charge stroke.

Typical direct strike building protection guidelines would be:

Negative stroke −50 kA peak current with a rise time of 5 $\mu$s and a 50% decay time of 50 $\mu$s followed by flashes of 50 kA with rise times of 0.25 $\mu$s and a 50% decay times of 50 $\mu$s repeated several times at 20 ms intervals.

Positive stroke −200 kA peak current with a rise time of 10 $\mu$s and a 50% decay time of 350 $\mu$s The energy from a direct or coupled lightning strike will typically be propagated through a metallic transmission system. As the overvoltage caused by the lightning strike propagates its wave shape will be modified by the transmission line characteristics. A "lossy" linear transmission line will tend to increase the rise and decay durations and attenuate the peak voltage. Coupling into adjacent transmission lines will share the energy leading to further reductions in peak voltage. Intermediate overvoltage protectors will either clamp the peak voltage amplitude or truncate the surge duration by shorting the surge to earth.

The telephone line is a specific transmission system. When the line enters a subscribers building it is usual to provide some form of overvoltage protection at this interface. This "Primary" or "Station" protector has traditionally been some form of sparkover device which shorts the line thereby preventing further propagation of the overvoltage. Air gaps, carbon blocks and GDTs provide this shorting function, but, due to reaction time, tend to allow the leading edge of the surge through. This exposes the subscribers equipment to a large voltage which can cause equipment failure.

Thyristor Overvoltage Protectors are solid state devices which combine a clamping and shorting action and so prevent the temporary overvoltage of the sparkover protector. Sparkover protectors generally tend to wear out as the surface materials erode or become contaminated. Thyristor based protectors effectively have an infinite life, provided that they are operated within their ratings.

One of the main problems with thyristor protectors is their cost. Surge current rating is proportional to the device area, which in turn determines the cost of the solid state material Nowadays, solid state protectors, based on silicon thyristors, have taken over the protection function in the telephone exchange end of a telephone line. The main reason for this, is that the surge conditions at the exchange are generally quite low. This is due to the fact that the surge energy is shared between a large number of exchange lines and in a controlled temperature range. The subscriber end of the line is the converse of this. There are fewer lines and thus higher surge energies are more commonplace. In addition there is a more uncontrolled temperature range, which effects the operation and life of the protector. Further, the cost of protector replacement is much greater.

For these reasons, deploying the thyristor protectors used at telephone exchange at the subscriber end of the line has not been successful in rural areas having a high lightning frequency. At best, the thyristor protector service life is equal to that of a GDT. As the subscribers environment is relatively uncontrolled it is not always possible to define the worst case surge conditions. This has tended to mean that protectors are designed for such areas which have much greater tolerances than may really be required. It is not uncommon for there to be a specification for subscriber protectors that scale the exchange protector surge current rating by factors of 2 to 4 times. Such specifications will scale the protector silicon cost by about the same factor.

In addition, the surge environment varies year by year and accordingly the typical worst case surge will also vary on a yearly basis. It is important that a surge rating value is established which covers all possible environmental conditions over a number of years. If one surge in a thousand exceeds the thyristor protector capability it will fail instantly, whereas sparkover protectors will only have a slight reduction in life.

The purpose of this invention is to make a thyristor protector which is optomised to the surge environment and the transmission system. This will lead to a protector with an asymmetrical surge capability which will minimise the protector cost compared to traditional design approaches.

Silicon thyristor protector technology uses different device areas for positive and negative surges. This means that it is possible to have dissimilar positive and negative characteristics by the design of the negative and positive surge areas. Further the silicon chip packaging can influence the device performance.

According to one aspect of the present invention, there is provided an overvoltage protection device for protecting equipment, the device comprising a first protection element for protecting the equipment from a positive surge and a second protection element for protecting the equipment from a negative surge, wherein the first and second elements have substantially asymmetric surge capabilities.

This has the advantage that the device offers surge protection in both a positive and a negative direction, without having a device which has higher surge capability than would actually be required in most typical situations. This clearly reduces the overall size of the protector, uses less silicon and therefore reduces the overall cost of the device.

Other aspects of the invention are defined in the remainder of the claims.

Reference will now be made, by way of example, to the accompanying drawings, in which.

The earlier lightning stroke discussion above, described how the positive surge current was typically four times larger in amplitude and seven times longer than the typical negative surge. On an amplitude basis therefore the positive protector area should be four times the negative area for equal current density. As the negative surge is generally of shorter duration a further reduction in the negative surge area would be possible. This leads to a design where the positive surge area might be 85% of the total surge area. However, this design is based on the direct lightning stroke before its energy has propagated through the transmission line to the subscriber. The resultant surge at the subscriber is likely to reduce the positive to negative dissimilarity, so a positive surge area of about 75% of the total surge area is required. A traditional protector design, with equal positive and negative surge areas, would require 50% more silicon area than this asymmetrical design.

For times below 100 $\mu$s the temperature rise caused by the surge energy is only determined by the silicon chip. For times above 10 $\mu$s the temperature rise caused by the surge energy becomes strongly dependent on the materials which contact the chip. The temperature rise in the time region between 100 $\mu$s and 10 $\mu$s is determined partly by the silicon chip and partly by the contact materials. Connecting good energy absorbing materials (e.g. Copper) to the chips surface where the maximum positive surge temperature rise occurs will further improve the surge capability.

To reduce corrosion, the direct current (DC) provided by the exchange comes from a negative battery supply. To restore normal operation after a negative surge, the negative polarity thyristor protector must switch-off at a current level above the short circuit DC provided by the exchange. In this situation, the positive protection thyristor does not need a minimum switch-off current as it is naturally commutated by the negative battery supply. In practice, to avoid spurious changes in voltage (dv/dt) triggering the positive protection thyristor will require a small minimum value of switch-off current. Some 5 to 10% of the thyristor area is used to set the switch-off current. In designing the positive polarity protector for a small value of switch-off current the switch-off area overhead can be reduced and the resultant reduced peripheral shorting will speed up switching time and improve surge performance. This improved surge performance will allow some reduction in the area of the positive polarity thyristor protector.

Figure 1A:
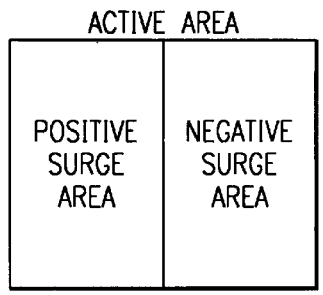
FIG. 1a is a diagram showing a possible area allocation for protectors according to the prior art and FIG. 1b and FIG. 1c are diagrams showing the possible area allocation accordingly to the present invention.
Figure 1B:
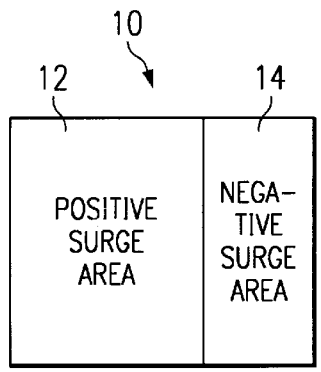
Figure 1C:
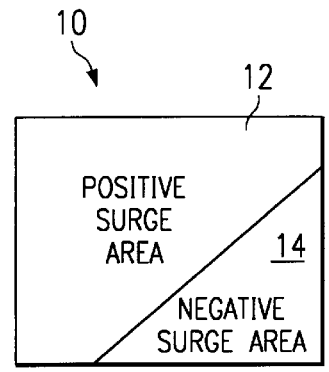
Figure 2:
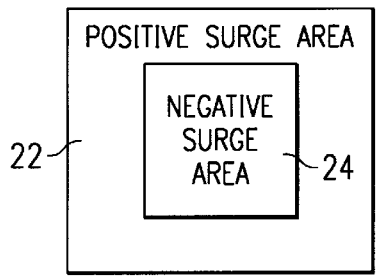
FIG. 2 is a diagram showing a design of one embodiment of the present invention, where the negative surge area is embedded in the positive surge area.

There are many possible design variations which realise an asymmetrical surge device. A few specific design approaches are outlined below.

Where the active surge areas for positive and negative are combined the proportion of the two surge areas can be adjusted from the normal 50% to the required ratio by moving the dividing line, FIG. 1. FIGS. 1b and 1c show two possible ways by which the area can be allocated Both show the positive surge area (12) taking up 75% of the whole silicon area (10), whilst the negative surge area (14) takes up only 25% of the whole area As the negative surge area is substantially smaller than the positive area, the negative surge area can be positioned as an "island"(24) in the positive surge area (22) as is shown in FIG. 2. This approach gives a sight improvement in negative surge area thermal capability, as it is surrounded by more silicon than it would be at the chip edge. Likewise, charge coupling between the positive and negative sections would be improved, which would promote polarity change conduction on oscillatory surge wave forms.

Figure 3:
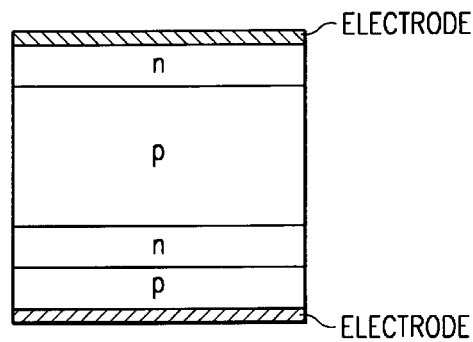
FIG. 3 is a diagram of a basic thyristor structure.
Figure 4:
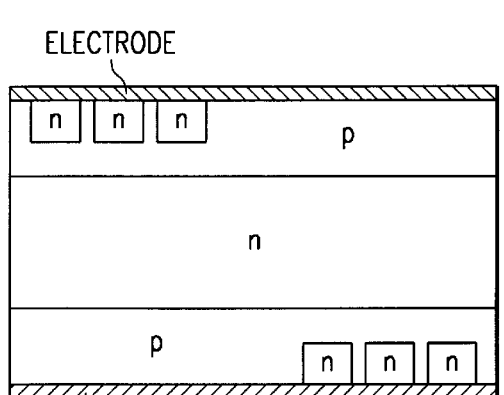
FIG. 4 is a diagram of a bidirectional thyristor structure.

A basic silicon unidirectional thyristor consists of silicon appropriately doped to give four layers of alternating p-type and n-type silicon to give a npnp structure, as is shown in FIG. 3. Each pn or np interface creates a junction, accordingly this structure has three junctions. The structure of FIG. 3 only switches in for one polarity. To operate in both polarities a second structure is added in anti parallel This structure is shown in FIG. 4. A requirement for telecommunications use is that the thyristor switches off below a certain DC level The required switch-off current is normally achieved by the use of p-type silicon shorts in the surface n-type layer and shorting the periphery of the surface n-type layer with p-type silicon.

Figure 5:
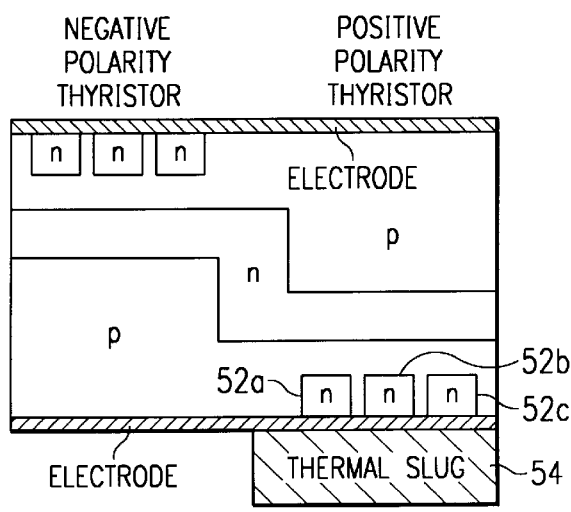
FIG. 5 is a diagram of a thyristor structure according to one aspect of the present invention.

The surge performance of the thyristor improves as the layer thickness reduces. However, for thinner layers the sensitivity of the chip to surface temperature rises is increased. For ease of handling during manufacture the overall silicon thickness needs to be in the region of 0.01 inches. To reduce the junction separation the surface p layer (50) can be diffused deep into the slice, which reduces the junction separation distances and electrically simulates a thinner device, as is shown in FIG. 5. The junctions concerned with positive polarity conduction (52a, 52b, 52c,) are closer to the bottom of the chip. The bottom of the chip will be the shortest thermal path for heat generated at these junctions under surge conditions. Hence the bottom of the chip is the most appropriate place to concentrate a heat extraction material or thermal slug (54).

One advantage presented by the invention is a thyristor overvoltage protection device which is matched to the lightning surge environment by having a substantially asymmetrical surge capability by reason of the respective areas allocated to positive and negative surge.

This in turn can produce ad improved long duration surge capability thyristor overvoltage protector having deep surface diffusions to reduce junction spacing with the addition of a heat slug contacting the surface closest to the positive polarity junctions.

In addition, the positive surge current per unit area thyristor overvoltage protection device is designed to have a negative switch-off current greater than the line short circuit dc and a positive switch-off current substantially less than the line short circuit dc by reason of a reduced shorting area.

We claim:

1. A semiconductor device providing overvoltage protection against electrical surges, said semiconductor device comprising:
   a substrate having upper and lower major surfaces and being of semiconductor material of one conductivity type;
   at least a first dopant region of the opposite conductivity type disposed in said substrate of one conductivity type and opening onto the upper major surface of said substrate;
   at least a second dopant region of the opposite conductivity type disposed in said substrate of one conductivity type and opening onto the lower major surface of said substrate said second dopant region being surrounded by semiconductor material of said one conducting type on three sides;
   a buried dopant region of the opposite conductivity type disposed in said substrate between said first and second dopant regions of the opposite conductivity type and in spaced relation with respect thereto, said buried dopant region of the opposite conductivity type being arranged at varying depths within said substrate of one conductivity type so as to define first and second thyristor structures in conjunction with the substrate of one conductivity type and the respective first and second dopant regions of the opposite conductivity type and in asymmetrical relation to each other.

2. A semiconductor device providing overvoltage protection against electrical surges, said semiconductor device comprising:
   a substrate having upper and lower major surfaces and being of semiconductor material of one conductivity type;
   at least a first dopant region of the opposite conductivity type disposed in said substrate of one conductivity type and opening onto the upper major surface of said substrate;
   at least a second dopant region of the opposite conductivity type disposed in said substrate of one conductivity type and opening onto the lower major surface of said substrate;
   a buried dopant region of the opposite conductivity type disposed in said substrate between said first and second dopant regions of the opposite conductivity type and in spaced relation with respect thereto, said buried dopant region of the opposite conductivity type being arranged at varying depths within said substrate of one conductivity type so as to define first and second thyristor structures in conjunction with the substrate of one conductivity type and the respective first and second dopant regions of the opposite conductivity type and in asymmetrical relation to each other wherein said at least a first dopant region of the opposite conductivity type is included in a first plurality of dopant regions of the opposite conductivity type disposed in said substrate of one conductivity type in spaced relation with respect to each other and opening onto the upper major surface of said substrate;
   said at least a second dopant region of the opposite conductivity type is included in a second plurality of dopant regions of the opposite conductivity type disposed in said substrate of one conductivity type in spaced relation with respect to each other and opening onto the lower major surface of said substrate; and
   said buried dopant region of the opposite conductivity type being disposed in said substrate between said first and second pluralities of dopant regions of the opposite conductivity type and in spaced relation with respect thereto such that the first and second thyristor structures are defined in conjunction with the substrate of one conductivity type and the respective first and second pluralities of dopant regions of the opposite conductivity type and in asymmetrical relation to each other.

3. A semiconductor device as set forth in claim 2, wherein said first thyristor structure is effective for overvoltage protection against an electrical surge of negative polarity; and
   said second thyristor structure is effective for overvoltage protection against an electrical surge of positive polarity.

4. A semiconductor as set forth in claim 3, wherein said buried dopant region of the opposite conductivity type includes respective first and second horizontally extending portions integrally connected by an intermediate vertically extending portion;
   the first horizontally extending portion of said buried dopant region of the opposite conductivity type being disposed beneath said first plurality of dopant regions of the opposite conductivity type in spaced relation thereto; and
   the second horizontally extending portion of said buried dopant region of the opposite conductivity type being disposed above said second plurality of dopant regions of the opposite conductivity type in spaced relation thereto.

5. A semiconductor device as set forth in claim 4, wherein the first horizontally extending portion of said buried dopant region of the opposite conductivity type is located within the substrate of one conductivity type at a shorter distance from the upper major surface of said substrate than the second horizontally extending portion of said buried dopant region of the opposite conductivity type.

6. A semiconductor device as set forth in claim 5, wherein said first plurality of dopant regions of the opposite conductivity type is out of vertical registration with said second plurality of dopant regions of the opposite conductivity type.

7. A semiconductor device as set forth in claim 6, further including first and second electrodes of electrically conductive material respectively disposed on the upper and lower major surfaces of said substrate of one conductivity type.

8. A semiconductor device as set forth in claim 7, further including a heat sink mounted on said second electrode beneath the lower major surface of said substrate of one conductivity type and beneath said second plurality of dopant regions of the opposite conductivity type, said heat sink being in vertical registration with said second plurality of dopant regions of the opposite conductivity type.

* * * * *